United States Patent
Chu et al.

(10) Patent No.: US 9,559,012 B1
(45) Date of Patent: Jan. 31, 2017

(54) GALLIUM NITRIDE COMPLEMENTARY TRANSISTORS

(71) Applicant: HRL LABORATORIES, LLC, Malibu, CA (US)

(72) Inventors: Rongming Chu, Agoura Hills, CA (US); Yu Cao, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/841,258

(22) Filed: Aug. 31, 2015

(51) Int. Cl.
- H01L 21/82 (2006.01)
- H01L 29/00 (2006.01)
- H01L 21/8238 (2006.01)
- H01L 27/092 (2006.01)
- H01L 29/20 (2006.01)
- H01L 29/06 (2006.01)
- H01L 23/535 (2006.01)

(52) U.S. Cl.
CPC ..... *H01L 21/823807* (2013.01); *H01L 23/535* (2013.01); *H01L 27/092* (2013.01); *H01L 29/0649* (2013.01); *H01L 29/2003* (2013.01)

(58) Field of Classification Search
CPC ........................ H01L 27/092; H01L 21/823807
See application file for complete search history.

(56) References Cited

U.S. PATENT DOCUMENTS

| | | | |
|---|---|---|---|
| 6,411,261 B1 | 6/2002 | Lilly | |
| 6,423,645 B1 | 7/2002 | Wei et al. | |
| 6,525,695 B2 | 2/2003 | McKinzie | |
| 6,538,621 B1 | 3/2003 | Sievenpiper et al. | |
| 6,917,343 B2 | 7/2005 | Sanchez et al. | |
| 7,245,269 B2 | 7/2007 | Sievenpiper et al. | |
| 7,555,219 B2 | 6/2009 | Cox et al. | |
| 8,124,505 B1 | 2/2012 | Burnham et al. | |
| 8,461,664 B2 * | 6/2013 | Bennett | H01L 27/0605 257/200 |

(Continued)

FOREIGN PATENT DOCUMENTS

| | | |
|---|---|---|
| JP | 2008/227501 | 9/2008 |
| JP | 2012/156164 | 8/2012 |

(Continued)

OTHER PUBLICATIONS

International Search Report and Written Opinion for PCT/US2015/047835 mailed on May 30, 2016.

(Continued)

*Primary Examiner* — Evan Pert
(74) *Attorney, Agent, or Firm* — Ladas & Parry (57) ABSTRACT

A semiconductor device includes a substrate, a III-nitride buffer layer on the substrate, an N-channel transistor including a III-nitride N-channel layer on one portion of the buffer layer, and a III-nitride N-barrier layer for providing electrons on top of the N-channel layer, wherein the N-barrier layer has a wider bandgap than the N-channel layer, a P-channel transistor including a III-nitride P-barrier layer on another portion of the buffer layer for assisting accumulation of holes, a III-nitride P-channel layer on top of the P-barrier layer, wherein the P-barrier layer has a wider bandgap than the P-channel layer, and a III-nitride cap layer doped with P-type dopants on top of the P-channel layer.

22 Claims, 6 Drawing Sheets

(56) References Cited

U.S. PATENT DOCUMENTS

| | | | | |
|---|---|---|---|---|
| 8,652,959 | B2* | 2/2014 | Bennett | H01L 27/0605 257/615 |
| 8,835,988 | B2* | 9/2014 | Marino | H01L 21/02381 257/200 |
| 8,853,709 | B2 | 10/2014 | Chu et al. | |
| 8,941,118 | B1 | 1/2015 | Chu et al. | |
| 8,946,779 | B2* | 2/2015 | Green | H01L 27/0629 257/195 |
| 8,957,831 | B1 | 2/2015 | Gregoire et al. | |
| 9,018,056 | B2* | 4/2015 | Kub | H01L 29/41725 257/194 |
| 9,059,200 | B1 | 6/2015 | Chu et al. | |
| 9,093,753 | B2 | 7/2015 | Jung et al. | |
| 9,362,281 | B2* | 6/2016 | Bayram | H01L 29/0642 |
| 9,431,243 | B2* | 8/2016 | Lochtefeld | H01L 21/02381 |
| 2002/0167457 | A1 | 11/2002 | McKinzie et al. | |
| 2003/0020092 | A1 | 1/2003 | Parikh et al. | |
| 2005/0056893 | A1 | 3/2005 | Hadizad | |
| 2005/0179096 | A1 | 8/2005 | Beach et al. | |
| 2006/0011915 | A1 | 1/2006 | Saito et al. | |
| 2006/0060871 | A1 | 3/2006 | Beach | |
| 2006/0194379 | A1 | 8/2006 | Suda et al. | |
| 2007/0141823 | A1 | 6/2007 | Preble et al. | |
| 2007/0210332 | A1 | 9/2007 | Ueno et al. | |
| 2007/0228416 | A1* | 10/2007 | Chen | H01L 21/8252 257/192 |
| 2008/0121895 | A1 | 5/2008 | Sheppard et al. | |
| 2008/0237605 | A1 | 10/2008 | Murata et al. | |
| 2008/0261378 | A1 | 10/2008 | Yao et al. | |
| 2009/0146186 | A1 | 6/2009 | Kub et al. | |
| 2009/0315078 | A1 | 12/2009 | Parikh et al. | |
| 2010/0025730 | A1 | 2/2010 | Heikman et al. | |
| 2010/0090251 | A1 | 4/2010 | Lorenz et al. | |
| 2010/0155780 | A1 | 6/2010 | Machida et al. | |
| 2011/0024798 | A1 | 2/2011 | Tamari et al. | |
| 2011/0180857 | A1* | 7/2011 | Hoke | H01L 21/76251 257/255 |
| 2011/0297916 | A1* | 12/2011 | Bennett | H01L 21/02398 257/24 |
| 2012/0126291 | A1 | 5/2012 | Mitsunaga et al. | |
| 2012/0235160 | A1 | 9/2012 | Heikman et al. | |
| 2012/0256811 | A1 | 10/2012 | Colburn et al. | |
| 2012/0261720 | A1 | 10/2012 | Puglisi et al. | |
| 2013/0001646 | A1 | 1/2013 | Corrion et al. | |
| 2013/0026495 | A1 | 1/2013 | Chu et al. | |
| 2013/0043485 | A1* | 2/2013 | Ueno | H01L 29/42316 257/76 |
| 2013/0082281 | A1* | 4/2013 | Laroche | H01L 27/1207 257/77 |
| 2013/0181224 | A1 | 7/2013 | Lim et al. | |
| 2013/0313609 | A1 | 11/2013 | Akutsu et al. | |
| 2014/0092396 | A1 | 4/2014 | Hopp | |
| 2014/0159050 | A1 | 6/2014 | Yoon et al. | |
| 2014/0191288 | A1 | 7/2014 | Kotani et al. | |
| 2014/0264379 | A1* | 9/2014 | Kub | H01L 29/41725 257/77 |
| 2014/0264380 | A1 | 9/2014 | Kub et al. | |
| 2014/0361371 | A1* | 12/2014 | Comeau | H01L 27/1203 257/351 |
| 2015/0041820 | A1* | 2/2015 | Renaud | H01L 29/778 257/76 |
| 2015/0060946 | A1 | 3/2015 | Makiyama | |
| 2015/0221649 | A1* | 8/2015 | Kub | H01L 29/41725 257/76 |
| 2015/0221760 | A1* | 8/2015 | Kub | H01L 29/41725 257/76 |
| 2015/0244080 | A1 | 8/2015 | Gregoire et al. | |

FOREIGN PATENT DOCUMENTS

| | | | | |
|---|---|---|---|---|
| WO | 2007/062589 | | 6/2007 | |
| WO | WO 2016/080961 | * | 5/2016 | H01L 21/8238 |

OTHER PUBLICATIONS

U.S. Appl. No. 14/290,029, filed May 29, 2014, Chu et al.

U.S. Appl. No. 14/838,958, filed Aug. 28, 2015, Chu et al.

Ambacher, O. et al., "Two-Dimensional Electron Gases Induced by Spontaneous and Piezoelectric Polarization Charges in N- and Ga-face AlGaN/GaN Heterostructures," *Journal of Applied Physics*, vol. 85, No. 6, pp. 3222-3233, (Mar. 15, 1999).

Burnham, Shawn D. et al., "Gate-Recessed Normally-Off GaN-on-Si HEMT Using a New O2-BCl3 Digital Etching Technique," *Physica Status Solidi C 7*, (ICNS-8), vol. 7, No. 7-8, pp. 2010-2012, (2010).

Buttari D. et al., "Digital Etching for Highly Reproducible Low Damage Gate Recessing on AlGaN/GaN HEMTs," *Proceedings, IEEE Lester Eastman Conference, High Performance Devices*, pp. 461-469, (Aug. 6-8, 2002).

Buttari D. et al., "Origin of Etch Delay Time in Cl2 Dry Etching of AlGaN/GaN Structures," *Applied Physics Letters*, vol. 83, No. 23, pp. 4779-4781, (Dec. 8, 2003).

Buttari D. et al., "Selective Dry Etching of GaN OVER AlGaN in BCL3/SF6 Mixtures," *Proceedings, IEEE Lester Eastman Conference, High Performance Devices*, vol. 14, No. 3, pp. 132-137, (Aug. 2004).

Cai, Yong et al., "High-Performance Enhancement-Mode AlGaN/GaN HEMTs Using Fluoride-Based Plasma Treatment," *IEEE Electron Device Letters*, vol. 26, No. 7, pp. 435-437, (Jul. 2005).

Chen, T. et al., "AlGaN/GaN MIS HEMT with ALD Dielectric," *Digest Of Cs MANTECH Conference*, pp. 227-230, (Apr. 24-27, 2006).

DeSalvo, Gregory C. et al., "Wet Chemical Digital Etching of GaAs at Room Temperature," *Journal of The Electrochemical Society*, vol. 143, No. 11, pp. 3652-3656, (Nov. 1996).

Hahn et al., "p-Channel Enhancement and Depletion Mode GaN-Based HFETs with Quaternary Backbarriers," *IEEE Transaction on Electron Devices*, vol. 60, No. 10, pp. 3005-3011, (Oct. 2013).

Harris H. et al., "Plasma Enhanced Metalorganic Chemical Vapor Deposition of Amorphous Aluminum Nitrade," *Journal of Applied Physics*, American Institute of Physics, vol. 90, No. 11, pp. 5825-5831, (Dec. 1, 2011).

Hashizume, T. et al., "Capacitance-Voltage Characterization of AlN/GaN Metal-Insulator-Semiconductor Structures Grown on Sapphire Substrate by Metalorganic Chemical Vapor Deposition," *Journal of Applied Physics*, vol. 88, No. 4, pp. 1983-1986, (Aug. 15, 2000).

Keogh, David et al., "Digital Etching of III-N Materials Using a Two-Step Ar/KOH Technique," *Journal of Electronic Materials*, vol. 35, No. 4, pp. 771-776, (2006).

Khan, M. Asif et al., "Enhancement and Depletion Mode GaN/AlGaN Heterostructure Field Effect Transistors," *Applied Physics Letters*, vol. 68, No. 4, pp. 514-516, (Jan. 22, 1996).

Lanford, W. B. et al., "Recessed-gate enhancement-mode GaN HEMT with high threshold voltage," *Electronics Letters*, vol. 41, No. 7, pp. 449-450, (Mar. 31, 2005).

Li, G. et al., "Polarization-Induced GaN-on-Insulator E/D Mode p-Channel Heterostructure FETs," *IEEE Electron Device Letters*, vol. 34, No. 7, pp. 852-854, (Jul. 2013).

Ludviksson, Audunn et al., "Atomic Layer Etching Chemistry of Cl2 on GaAs(100)," *Surface Science*, vol. 277, pp. 282-300, (1992).

Maher, H. et al., "Smooth Wet Etching by Ultraviolet-Assisted Photoetching and Its Application to the Fabrication of AlGaN/GaN Heterostructure Field-Effect Transistors," *Applied Physics Letters*, vol. 77, No. 23, pp. 3833-3835, (Dec. 4, 2000).

Moon, Jeong S. et al., "Submicron Enhancement-mode AlGaN/GaN HEMTs," *Device Research Conference, 60th DRC. Conference Digest*, pp. 23-24, (2002).

Okamoto Y. et al., "179 W Recessed-Gate AlGaN/GaN Heterojunction FET with Field-Modulating Plate," *Electronics Letters*, vol. 40, No. 10, (May 13, 2004).

Parish, G. et al., "Simple Wet Etching of GaN," *Proceedings of SPIE, Device and Process Technologies for MEMS and Microelectronics II*, vol. 4592, pp. 104-110, (2001).

(56) References Cited

OTHER PUBLICATIONS

Shatalov, M. et al., "GaN/AlGaN p-Channel Inverted Heterostructure JFET," *IEEE Electron Device Letters*, vol. 23, No. 8, pp. 452-454, (Aug. 2002).
Zimmermann, T. et al., "P-Channel InGaN HFET Structure Based on Polarization Doping," *IEEE Electron Device Letters*, vol. 25, No. 7, pp. 450-452, (Jul. 2004).
EPO Extended Search Report with Search Opinion for European Patent Application No. 12819630.0 mailed on Mar. 6, 2015.
Chapter II International Preliminary Report on Patentability (IPRP) for PCT/US2012/043114 mailed on Jul. 3, 2013.
Chapter II International Preliminary Report on Patentability (IPRP) for PCT/US2013/062750 mailed on Aug. 25, 2015.
International Search Report and Written Opinion for PCT/US2012/043114 mailed on Dec. 26, 2012.
International Search Report and Written Opinion for PCT/US2013/062750 mailed on Jun. 26, 2014.
International Search Report and Written Opinion for PCT/US2014/055881 mailed on Dec. 22, 2014.
From U.S. Appl. No. 12/909,497 (Now U.S. Pat. No. 8,124,505), Non-Final Rejection mailed on May 31, 2011.
From U.S. Appl. No. 12/909,497 (Now U.S. Pat. No. 8,124,505), additional Non-Final Rejection mailed on May 31, 2011.
From U.S. Appl. No. 12/909,497 (Now U.S. Pat. No. 8,124,505), Notice of Allowance mailed on Oct. 24, 2011.
From U.S. Appl. No. 12/909,497 (Now U.S. Pat. No. 8,124,505), Notice of Allowance mailed on Nov. 10, 2011.
From U.S. Appl. No. 13/456,039 (Now U.S. Pat. No. 8,853,709), Rejection/Election mailed on Mar. 22, 2013.
From U.S. Appl. No. 13/456,039 (Now U.S. Pat. No. 8,853,709), Non-Final Rejection mailed on Apr. 3, 2013.
From U.S. Appl. No. 13/456,039 (Now U.S. Pat. No. 8,853,709), Final Rejection mailed on Jul. 12, 2013.
From U.S. Appl. No. 13/456,039 (Now U.S. Pat. No. 8,853,709), Advisory Action mailed on Sep. 6, 2013.
From U.S. Appl. No. 13/456,039 (Now U.S. Pat. No. 8,853,709), Non-Final Rejection mailed on Apr. 14, 2014.
From U.S. Appl. No. 13/456,039 (Now U.S. Pat. No. 8,853,709), Notice of Allowance mailed on Jun. 6, 2014.
From U.S. Appl. No. 13/456,039 (Now U.S. Pat. No. 8,853,709), Notice of Allowance mailed on Aug. 12, 2014.
From U.S. Appl. No. 14/041,667 (Now U.S. Pat. No. 8,941,118), Notice of Allowance mailed on Sep. 19, 2014.
From U.S. Appl. No. 14/290,029 (Unpublished, Non Publication Requested), Non-Final Rejection mailed on Apr. 24, 2015.
From U.S. Appl. No. 14/469,187 (Now U.S. Pat. No. 9,059,200), Non-Final Rejection mailed on Nov. 25, 2014.
From U.S. Appl. No. 14/469,187 (Now U.S. Pat. No. 9,059,200), Notice of Allowance mailed on Feb. 13, 2015.
From U.S. Appl. No. 14/469,187 (Now U.S. Pat. No. 9,059,200), Notice of Allowance mailed on May 11, 2015.
From U.S. Appl. No. 14/838,958 (Unpublished, Non Publication Requested, Filed Aug. 28, 2015), Application and Office Actions.
From U.S. Appl. No. 14/188,225 (Now Published as 2015/0244080), Non-Final Rejection mailed on Nov. 3, 2015.

\* cited by examiner

FIG. 1

6. P-Area Passivation

FIG. 2G

8. P-Gate Trench

FIG. 2H

9 N-Gate Trench

FIG. 2I

10. Gate Dielectric Deposition

GALLIUM NITRIDE COMPLEMENTARY TRANSISTORS

CROSS REFERENCE TO RELATED APPLICATIONS

This application is related to L&P 629865-2, U.S. patent application Ser. No. 14/041,667 filed Sep. 30, 2013, and U.S. Pat. No. 8,853,709, issued Oct. 7, 2014, which are incorporated herein by reference as though set forth in full.

STATEMENT REGARDING FEDERAL FUNDING

None

TECHNICAL FIELD

This disclosure relates to GaN complementary metal-oxide-semiconductor (CMOS) technology.

BACKGROUND

GaN N-channel transistors are known in the prior art to have excellent high-power and high-frequency performance. However, there are applications in which it is desirable to have a P-channel GaN transistor that can work with a GaN N-channel transistor on the same integrated circuit or substrate so that a high performance complementary metal-oxide-semiconductor (CMOS) integrated-circuit (IC) can be realized. The embodiments of the present disclosure answer these and other needs.

SUMMARY

In a first embodiment disclosed herein, a semiconductor device comprises a substrate, a III-nitride buffer layer on the substrate, an N-channel transistor comprising a III-nitride N-channel layer on one portion of the buffer layer, and a III-nitride N-barrier layer for providing electrons on top of the N-channel layer, wherein the N-barrier layer has a wider bandgap than the N-channel layer, a P-channel transistor comprising a III-nitride P-barrier layer on another portion of the buffer layer for assisting accumulation of holes, a III-nitride P-channel layer on top of the P-barrier layer, wherein the P-barrier layer has a wider bandgap than the P-channel layer, and a III-nitride cap layer doped with P-type dopants on top of the P-channel layer.

In another embodiment disclosed herein, a method for providing a semiconductor device comprises forming a III-nitride (III-N) layer buffer layer on a substrate, forming a III-N N-channel layer on the buffer layer, forming a III-N N-barrier layer on the N-channel layer, forming a first dielectric layer on top of the N-barrier layer, etching the first dielectric layer, the N-barrier layer, and the N-channel layer to form a first mesa for an N-channel transistor and to expose a portion of the buffer layer, forming a second dielectric layer over the first mesa and over a first area of the exposed portion of the buffer layer, wherein the first area is adjacent the first mesa, and wherein a remaining portion of the buffer layer is exposed, forming on top of the remaining exposed portion of the buffer layer a III-N P-barrier layer, forming on top of the III-N P-barrier layer a III-N P-channel layer, forming on top of the III-N P-channel layer a III-N P-cap layer, wherein the III-N P-barrier layer, the III-N P-channel layer, and the III-N P-cap layer form a second mesa for a P-channel transistor, and wherein the first and second mesa are separated by the first area on the buffer layer, removing the second dielectric, and implanting ions in the buffer layer between the first mesa and the second mesa for providing isolation between the N-channel transistor and the P-channel transistor.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a GaN CMOS technology which integrates N-channel and P-channel GaN transistors on the same wafer. The result is a high performance GaN-based complementary metal-oxide-semiconductor (CMOS) integrated circuit. CMOS IC is the preferred topology for many circuit applications, due to its high noise immunity and low power consumption.

L&P 629856-2, which is incorporated by reference, describes a P-channel transistor. The GaN ICs of the present disclosure integrate N-channel and P-channel transistors on a common substrate and have better performance than a circuit with discrete GaN N-channel and/or P-channel transistors because more functionality can be achieved with less power consumption. An advantage of the GaN ICs of the present disclosure is that their performance is better than what can be attained with Si CMOS, because high performance N-channel and P-channel GaN transistors are used.

Figure 1:
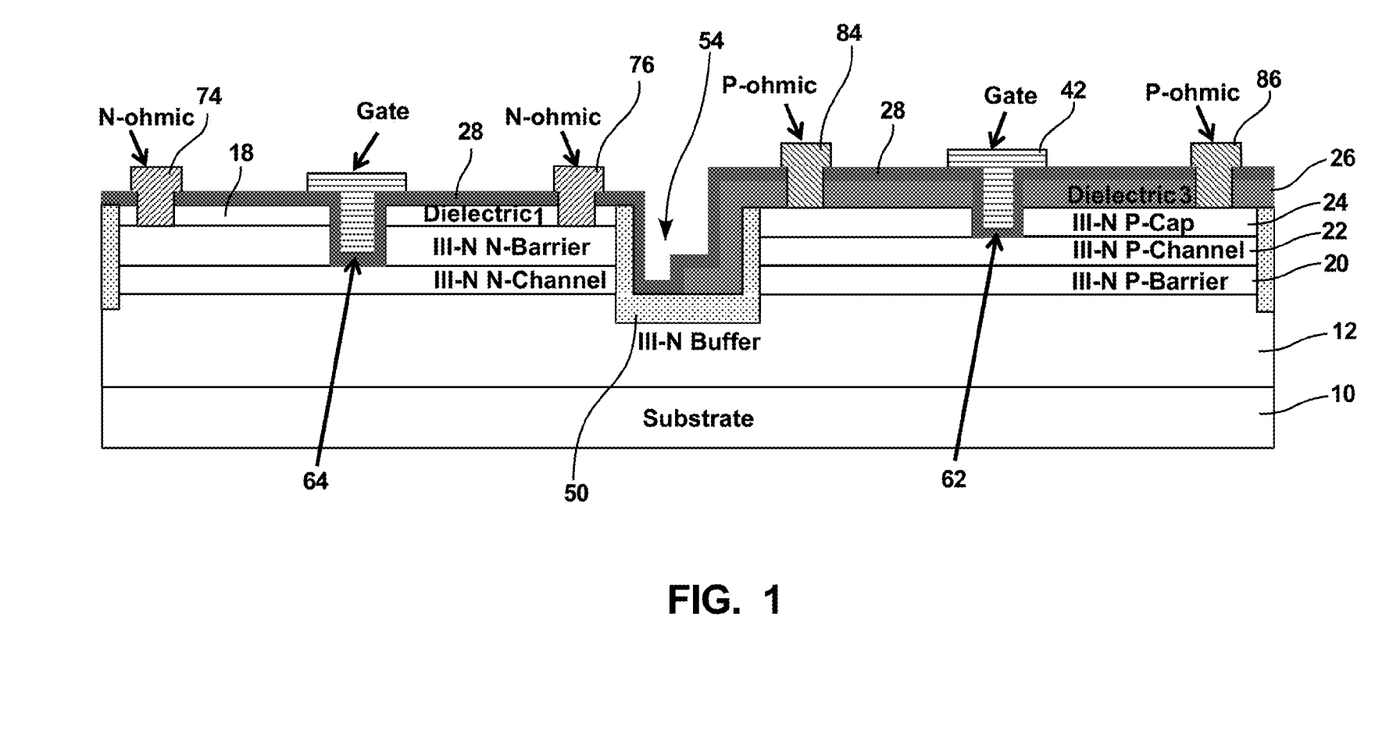
FIG. 1 shows a cross-section of a GaN based complementary metal-oxide-semiconductor (CMOS) integrated circuit with N-channel and P-channel transistors in accordance with the present disclosure.

FIG. 1 shows a cross-section of a GaN based complementary metal-oxide-semiconductor (CMOS) integrated circuit with N-channel and P-channel transistors in accordance with the present disclosure. The substrate 10 can be GaN, AlN, Sapphire, SiC, Si or any other suitable substrate material. FIG. 1 is further described below with reference to FIG. 2O.

FIGS. 2A, 2B, 2C, 2D, 2E, 2F, 2G, 2H, 2I, 2J, 2K, 2L, 2M, 2N, and 2O show a process flow for fabrication a GaN based complementary metal-oxide-semiconductor (CMOS) integrated circuit with N-channel and P-channel transistors in accordance with the present disclosure. FIG. 2O is the same as FIG. 1, but is also shown in the process flow for completeness.

Figure 2A:
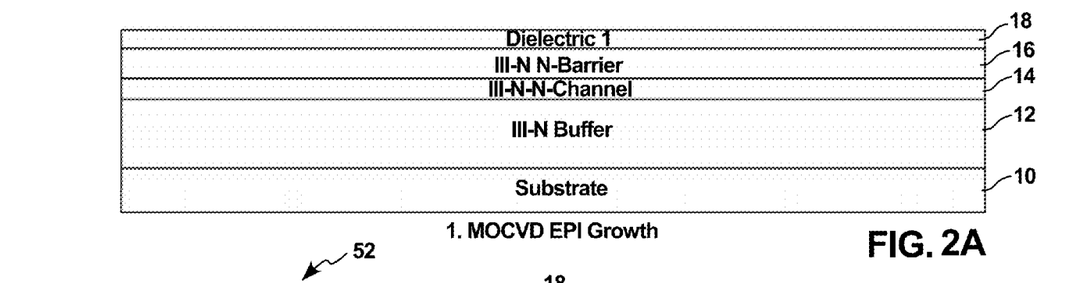
FIGS. 2A, 2B, 2C, 2D, 2E, 2F, 2G, 2H, 2I, 2J, 2K, 2L, 2M, 2N, and 2O show a process flow for fabrication a GaN based complementary metal-oxide-semiconductor (CMOS) integrated circuit with N-channel and P-channel transistors in accordance with the present disclosure.

Referring now to FIG. 2A, a III-N layer buffer layer 12 is on the substrate 10, and may be grown by chemical vapor deposition (MOCVD) or molecular beam epitaxy (MBE).

The buffer layer 12 may be GaN. On top of the buffer layer 12 is III-N N-channel layer 14, which may be GaN, and which may be grown by MOCVD or MBE. On top of the III-N N-channel layer 14 is a III-N N-barrier layer 16, which may be grown by MOCVD or MBE. The barrier layer 16 can be AlGaN, AlInN, AlInGaN, AlN, or a combination of these layers. The barrier layer 16 has a wider bandgap than the N-channel layer 14, and the thickness of the barrier layer 16 is typically in the range of 1~100 nm.

A layer of dielectric 18 is deposited on top of the N-barrier layer 16. The dielectric 18 may be SiN, $SiO_2$, SiON, AlN, or any combination of those, and may have a thickness of 1~500 nm.

Figure 2B:
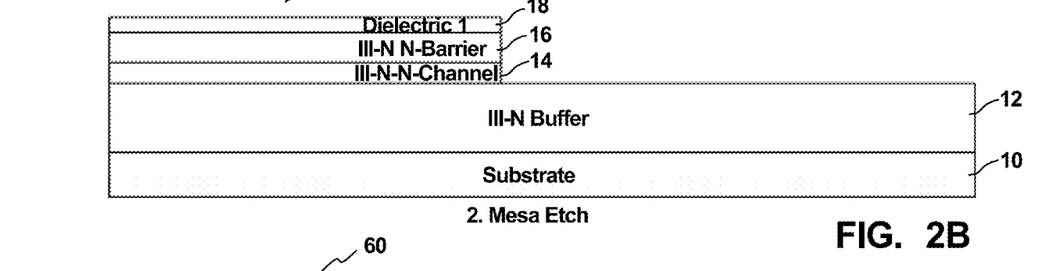

Next with reference to FIG. 2B, the dielectric 18, the barrier layer 16, and the channel layer 14 are etched to create a mesa 52 of the channel layer 14, the barrier layer 16 and the dielectric 18 and to expose a portion of the buffer layer 12.

Figure 2C:
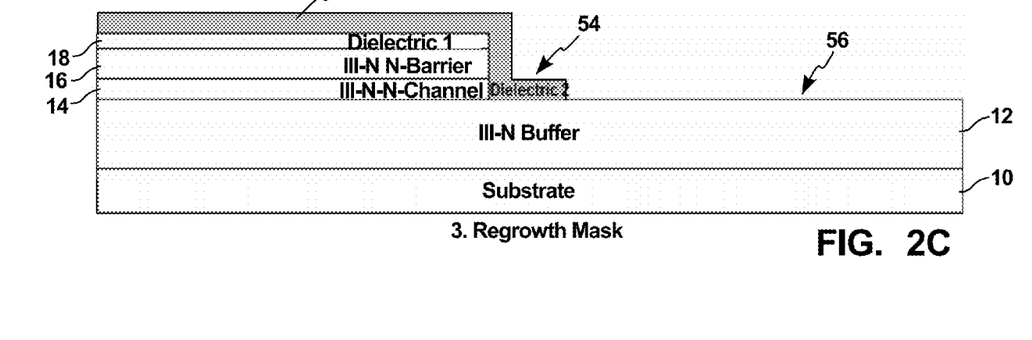

Then as shown in FIG. 2C, a dielectric 60 is formed over the mesa 52 and over an area 54 of the exposed portion of the buffer layer 12.

Figure 2D:
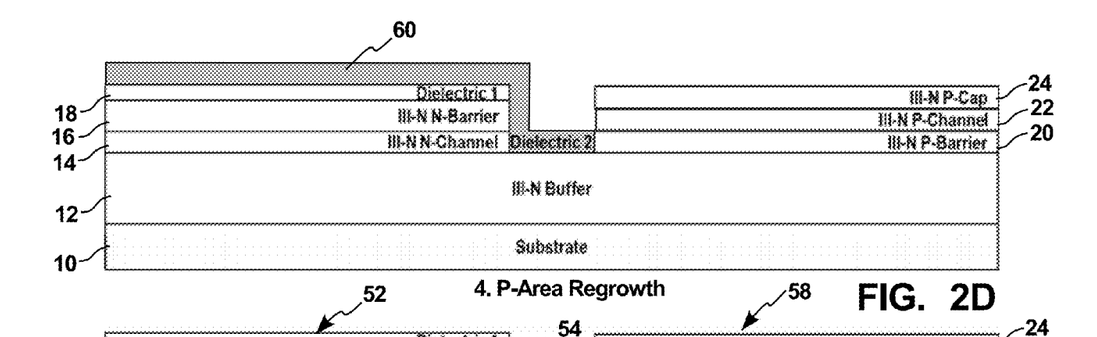

Next with reference to FIG. 2D, on top of the remaining portion 56 of the buffer layer 12, a III-N P-barrier layer 20 may be grown by MOCVD or MBE. The P-barrier layer 20 can be AlGaN, AlInN, AlInGaN, AlN, or a combination of these. The thickness of the P-barrier layer 20 is typically in the range of 1~100 nm. The P-barrier layer 20 assists in the accumulation of holes. On top of the III-N P-barrier layer 20, a III-N P-channel layer 22 may be grown by MOCVD or MBE. The P-channel layer 22 is typically GaN, with a narrower bandgap than the P-barrier layer 20. The thickness of the P-channel layer 22 is typically in the range of 1~100 nm.

On top of the III-N P-channel layer 22, a III-N P-cap layer 24 may be grown by MOCVD or MBE. The III-N P-cap layer 24 is typically GaN doped with Mg. The Mg concentration can vary across the P-cap layer 24. The thickness of the P-cap layer 24 is typically 1~100 nm.

Figure 2E:
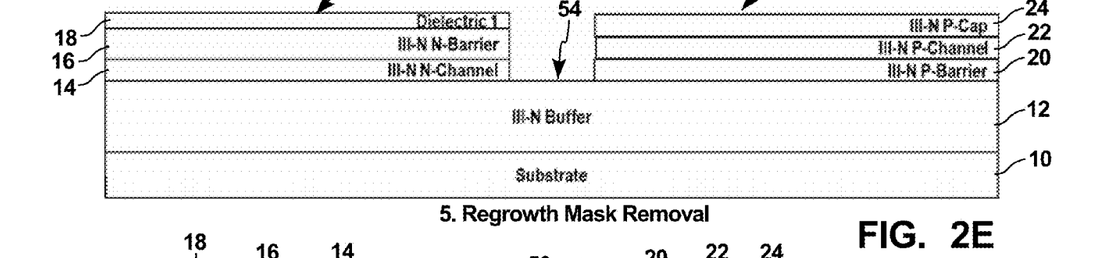

Then, as shown in FIG. 2E, the dielectric 60, which masked the mesa 52 and the area 54 of the buffer layer 12 while forming the P-barrier layer, the P-channel layer, and the P-cap layer, is removed. The result, as shown in FIG. 2E is the mesa 52 for an N-channel transistor, and a mesa 58 for a P-channel transistor.

Figure 2F:
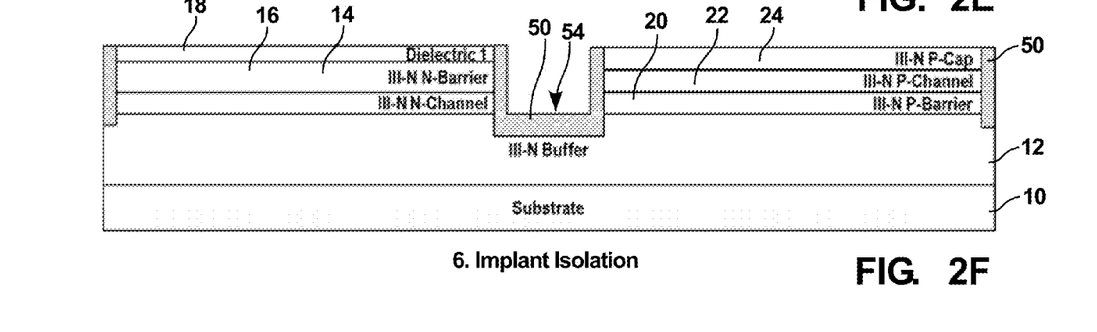

Next, as shown in FIG. 2F, the mesa 52 may be isolated from the mesa 58 by ion implantation 50 in the area 54 and on the sides of mesas 52 and 58.

Figure 2G:
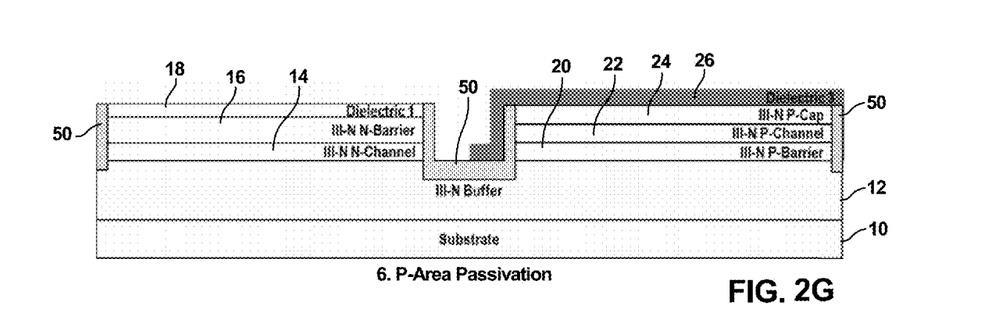

Then, as shown in FIG. 2G, a dielectric 26 is deposited over the P-cap layer 24 of mesa 58, and over a portion of area 54 between the mesa 52 and the mesa 58.

Figure 2H:
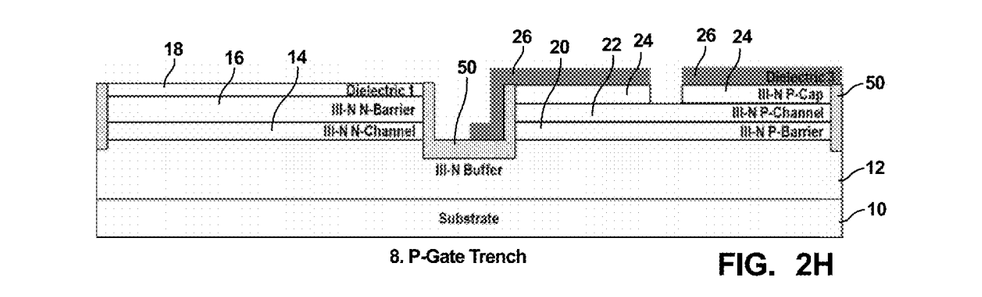

Next, as shown in FIG. 2H, a P-gate trench 62 is formed in dielectric 26. The bottom of the P-gate trench 62 may extend partially or entirely through the P-cap layer 24, and may also extend partially through the P-channel layer 22.

Figure 2I:
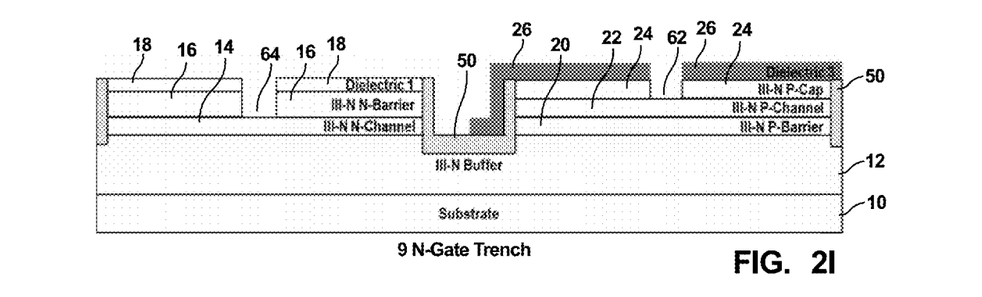

Then, as shown in FIG. 2I, a N-gate trench 64 is formed in dielectric 18. The bottom of the trench 64 may extend partially or entirely through the dielectric 18, partially or entirely through the barrier layer 16, and partially or entirely through the N-channel layer 14, so that the N-gate trench stops anywhere between the top surface of dielectric 18 and the top surface of the buffer layer 12.

Figure 2J:
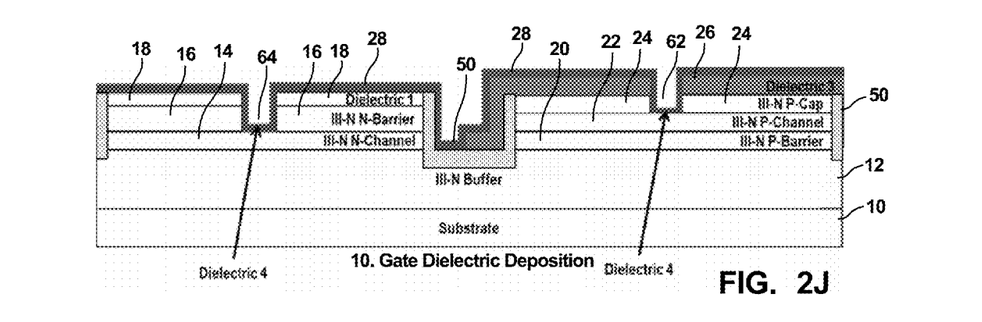

Next, as shown in FIG. 2J, a dielectric 28 is formed over the device, so that the dielectric 28 is on top of dielectric 18, covering the bottom and sides of N-gate trench 64, on top of dielectric 26, and covering the bottom and sides of P-gate trench 62. The dielectric 28 is typically a stack of AlN/SiN layer, grown by MOCVD. The dielectric 28 may also be only deposited in the N-gate trench 64 and the P-gate trench 62 to insulate the N-gate electrode 32 and the P-gate electrode 42, respectively, for low gate leakage current.

Figure 2K:
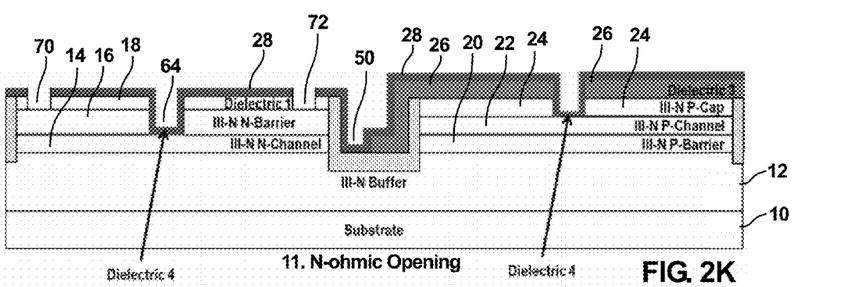

Then, as shown in FIG. 2K, N-ohmic openings 70 and 72 are made on opposite sides of the N-gate trench 64. The openings 70 and 72 are made through the dielectric 28, and may be made partially or entirely through the dielectric 18, and in some cases partially or entirely through the N-barrier layer 16.

Figure 2L:
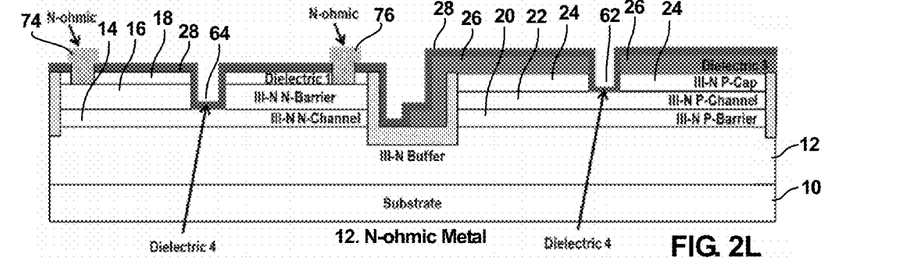

Next, as shown in FIG. 2L, the openings 70 and 72 are filled with metal to form N-ohmic electrodes 74 and 76, forming source and drain contacts, respectively, for the N-channel transistor.

Figure 2M:
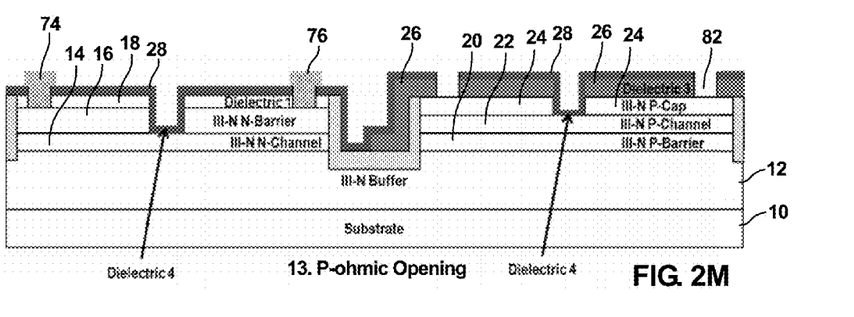

Then, as shown in FIG. 2M, P-ohmic openings 80 and 82 are formed on opposite sides of the P-gate trench 62. The openings 80 and 82 are made through the dielectric 28, through the dielectric 26, and in some cases partially or entirely through the P-cap layer 24.

Figure 2N:
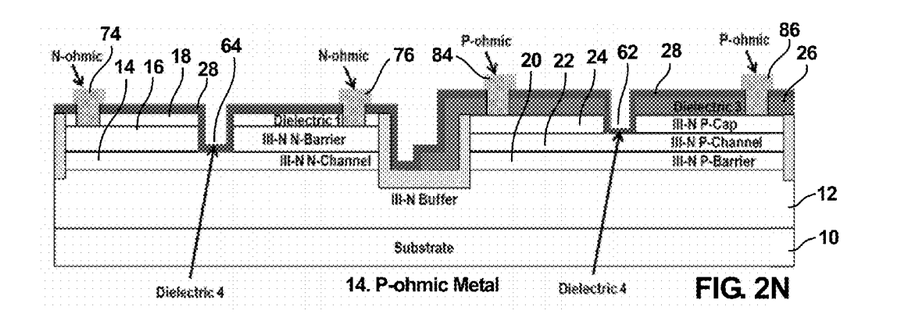
Figure 2O:
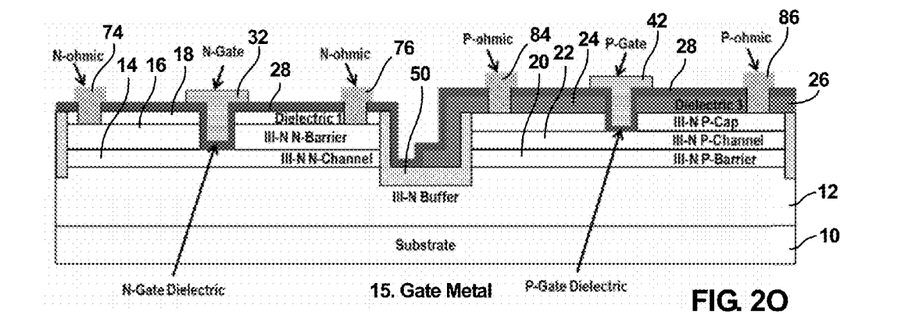

Next, as shown in FIG. 2N, the openings 80 and 82 are filled with metal to form P-ohmic electrodes 84 and 86, forming source and drain contacts, respectively, for the P-channel transistor.

Finally, as shown in FIG. 2O, the N-gate trench 64 is filled with metal 32 to form a gate contact for the N-channel transistor, and the P-gate trench 62 is filled with metal 42 to form a gate contact for the P-channel transistor.

The result is a GaN based complementary metal-oxide-semiconductor (CMOS) integrated circuit with N-channel and P-channel transistors, as shown in FIG. 1, which is the same as FIG. 2O.

Referring now to FIG. 1, the substrate 10 may be but is not limited to GaN, AlN, Sapphire, SiC, or Si. The III-N buffer layer 12 is on the substrate 10. As shown in FIG. 1, on top of one portion of the buffer layer 12, is the III-N N-channel layer 14 on the buffer layer 12, and the III-N N-barrier layer 16 on the N-channel layer 14. On top of another portion of the buffer layer 12, is the III-N P-barrier layer 20 on the buffer layer 12, the III-N P-channel layer 22 on the P-barrier layer 20, and the III-N P-Cap layer 24 on the P-channel layer 22.

The dielectric 28 covers the bottom and sides of N-gate trench 64, and the bottom and sides of P-gate trench 62, as described above. Metal 32 fills gate trench 64 to form a gate contact for the N-channel transistor, and metal 42 fills gate trench 62 to form a gate contact for the P-channel transistor.

N-ohmic electrodes 74 and 76 provide source and drain contacts, respectively, for the N-channel transistor, and P-ohmic electrodes 84 and 86 provide source and drain contacts, respectively, for the P-channel transistor.

Ion implantation 50 in the area 54 between the N-channel transistor and the P-channel transistor provides isolation of the N-channel transistor from the P-channel transistor.

A person skilled in the art will understand that the order of the steps of the process flow of FIGS. 2A, 2B, 2C, 2D, 2E, 2F, 2G, 2H, 2I, 2J, 2K, 2L, 2M, 2N, and 2O may be in another order to achieve the GaN based complementary metal-oxide-semiconductor (CMOS) integrated circuit shown in FIG. 1. A person skilled in the art will also understand that well known steps of patterning and etching may be used in the process flow, such as for example to remove a layer or portion of a layer. Such well known processes are not described in detail, because they are widely used in semiconductor processing.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A semiconductor device comprising:
   a substrate;
   a III-nitride (III-N) buffer layer on the substrate;
   an N-channel transistor comprising:
      a III-nitride N-channel layer on one portion of the buffer layer; and
      a III-nitride N-barrier layer for providing electrons on top of the N-channel layer, wherein the N-barrier layer has a wider bandgap than the N-channel layer;
   a P-channel transistor comprising:
      a III-nitride P-barrier layer on another portion of the buffer layer for assisting accumulation of holes;
      a III-nitride P-channel layer on top of the P-barrier layer, wherein the P-barrier layer has a wider bandgap than the P-channel layer; and
      a III-nitride P-cap layer doped with P-type dopants on top of the P-channel layer.

2. The semiconductor device of claim 1 wherein:
   the N-channel transistor comprises a first mesa on the buffer layer; and
   the P-channel transistor comprises a second mesa on the buffer layer.

3. The semiconductor device of claim 2 further comprising:
   ion implantation in an area of the buffer layer between the first mesa and the second mesa for providing isolation between the N-channel transistor and the P-channel transistor.

4. The semiconductor device of claim 1 wherein:
   the substrate comprises GaN, AlN, Sapphire, SiC, or Si.

5. The semiconductor device of claim 1 wherein:
   the III-nitride buffer layer comprises GaN.

6. The semiconductor device of claim 1 wherein:
   the III-N N-channel layer comprises GaN.

7. The semiconductor device of claim 1:
   wherein the III-N N-barrier layer comprises one of more of AlGaN, AlInN, AlInGaN, or AlN; and
   wherein the N-barrier layer has a wider bandgap than the N-channel layer.

8. The semiconductor device of claim 1:
   wherein the P-barrier layer comprises one or more of AlGaN, AlInN, AlInGaN, or AlN.

9. The semiconductor device of claim 1:
   wherein the P-channel layer comprises GaN; and
   wherein the P-channel layer has a narrower bandgap than the P-barrier layer.

10. The semiconductor device of claim 1:
    wherein the P-cap layer comprises Mg.

11. The semiconductor device of claim 1 further comprising:
    an N-gate trench extending partially or entirely through the N-barrier layer, and partially or entirely through the N-channel layer, so that a bottom of the N-gate trench stops anywhere between a top surface of the N-barrier layer and a top surface of the buffer layer;
    a P-gate trench extending partially or entirely through the P-cap layer, and partially through the P-channel layer, so that a bottom of the P-gate trench stops anywhere between a top surface of the P-cap layer and within the P-channel layer;
    a dielectric lining the N-gate trench and the P-gate trench; and
    first metal in the N-gate trench for an N-gate contact;
    second metal in the P-gate trench for a P-gate contact;
    source and drain N-ohmic contacts on opposite sides of the N-gate contact on the N-barrier layer or the on the N-channel layer; and
    source and drain P-ohmic contacts on opposite sides of the P-gate contact on the P-cap layer or the on the P-channel layer.

12. A method for providing a semiconductor device comprising:
    forming a III-nitride (III-N) buffer layer on a substrate;
    forming a III-N N-channel layer on the buffer layer;
    forming a III-N N-barrier layer on the N-channel layer;
    forming a first dielectric layer on top of the N-barrier layer;
    etching the first dielectric layer, the N-barrier layer, and the N-channel layer to form a first mesa for an N-channel transistor and to expose a portion of the buffer layer;
    forming a second dielectric layer over the first mesa and over a first area of the exposed portion of the buffer layer, wherein the first area is adjacent the first mesa, and wherein a remaining portion of the buffer layer is exposed;
    forming on top of the remaining exposed portion of the buffer layer a III-N P-barrier layer;
    forming on top of the III-N P-barrier layer a III-N P-channel layer;
    forming on top of the III-N P-channel layer a III-N P-cap layer, wherein the III-N P-barrier layer, the III-N P-channel layer, and the III-N P-cap layer form a second mesa for a P-channel transistor, and wherein the first and second mesa are separated by the first area on the buffer layer;
    removing the second dielectric; and implanting ions in the buffer layer between the first mesa and the second mesa for providing isolation between the N-channel transistor and the P-channel transistor.

13. The method of claim 12 further comprising:
forming a third dielectric over the P-cap layer and over a portion of the first area between the first and second mesas;
forming a P-gate trench 62 in the third dielectric, wherein a bottom of the P-gate trench extends partially or entirely through the P-cap layer, or extends partially through the P-channel layer; and
forming an N-gate trench in the first dielectric, wherein the bottom of the N-gate trench extends partially or entirely through the first dielectric, partially or entirely through the N-barrier layer, or partially or entirely through the N-channel layer, so that the N-gate trench stops anywhere between a top surface of the first dielectric and a top surface of the buffer layer; and
forming a fourth dielectric on top of the first dielectric, over the bottom and sides of the N-gate trench, on top of the third dielectric, and over the bottom and sides of the P-gate trench.

14. The method of claim 13 further comprising:
etching first and second openings on opposite sides of the N-gate trench;
filling the first and second openings with metal to form N-ohmic electrodes for source and drain contacts, respectively, for the N-channel transistor;
etching third and fourth openings on opposite sides of the P-gate trench; and
filling the third and fourth openings with metal to form P-ohmic electrodes for source and drain contacts, respectively, for the P-channel transistor.

15. The method of claim 13 further comprising:
filling the N-gate trench with metal to form a gate contact for the N-channel transistor;
filing the P-gate trench with metal to form a gate contact for the P-channel transistor.

16. The method of claim 12 wherein:
the substrate comprises GaN, AlN, Sapphire, SiC, or Si.

17. The method of claim 12 wherein:
the III-N buffer layer comprises GaN.

18. The method of claim 12 wherein:
the III-N N-channel layer comprises GaN.

19. The method of claim 12 wherein:
wherein the III-N N-barrier layer comprises one of more of AlGaN, AlInN, AlInGaN, or AlN; and
wherein the N-barrier layer has a wider bandgap than the N-channel layer.

20. The method of claim 12 wherein:
wherein the P-barrier layer comprises one or more of AlGaN, AlInN, AlInGaN, or AlN.

21. The method of claim 12 wherein:
wherein the P-channel layer comprises GaN; and
wherein the P-channel layer has a narrower bandgap than the P-barrier layer.

22. The method of claim 12 wherein:
wherein the P-cap layer comprises Mg.

* * * * *